(12) United States Patent
Zimmer et al.

(10) Patent No.: US 11,037,974 B2
(45) Date of Patent: Jun. 15, 2021

(54) OPTICAL SENSORS IN SEMICONDUCTOR DEVICES

(71) Applicants: Alexander Zimmer, Uhlstadt-Kirchhasel (DE); Daniel Gabler, Apolda (DE); Matthias Krojer, Ilmenau (DE)

(72) Inventors: Alexander Zimmer, Uhlstadt-Kirchhasel (DE); Daniel Gabler, Apolda (DE); Matthias Krojer, Ilmenau (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 1 day.

(21) Appl. No.: 16/266,825

(22) Filed: Feb. 4, 2019

(65) Prior Publication Data
US 2019/0363125 A1 Nov. 28, 2019

(30) Foreign Application Priority Data
May 24, 2018 (GB) ..................... 1808516

(51) Int. Cl.
*H01L 27/146* (2006.01)
*G02B 3/08* (2006.01)

(52) U.S. Cl.
CPC ........ *H01L 27/14627* (2013.01); *G02B 3/08* (2013.01); *H01L 27/1462* (2013.01); *H01L 27/14636* (2013.01); *H01L 27/14643* (2013.01); *H01L 27/14685* (2013.01)

(58) Field of Classification Search
CPC ......... H01L 27/14627; H01L 27/1462; H01L 27/14636; H01L 27/14643; H01L 27/14685; H01L 31/02327; H01L 27/146–27/14893; H01L 31/0543; G02B 3/08; Y02E 10/52
See application file for complete search history.

(56) References Cited

U.S. PATENT DOCUMENTS

2003/0155593 A1 8/2003 Kang et al.
2018/0358483 A1* 12/2018 Kautzsch .......... H01L 31/02016

FOREIGN PATENT DOCUMENTS

WO 2017/022450 A1 2/2017

OTHER PUBLICATIONS

U.K. Intellectual Property Office (UKIPO), Search Report, Application No. GB1808516.7, 4 pages, dated Oct. 31, 2018.

* cited by examiner

*Primary Examiner* — Stephen W Smoot
*Assistant Examiner* — Vicki B. Booker
(74) *Attorney, Agent, or Firm* — Thompson Hine LLP

(57) ABSTRACT

An optical sensor in an integrated Complementary Metal Oxide Semiconductor, CMOS, device, the sensor including a sensor element with an optical active region and a CMOS backend stack including one or more layers. The sensor further includes an optical lens formed in a layer of the one or more layers and arranged to direct light incident upon it towards the sensor element.

11 Claims, 5 Drawing Sheets

OPTICAL SENSORS IN SEMICONDUCTOR DEVICES

This application claims priority to UK application No. 1808516.7, filed on May 24 2018 and entitled OPTICAL SENSORS IN SEMICONDUCTOR DEVICES, the entire contents of which are hereby incorporated by reference.

TECHNICAL FIELD

This disclosure relates to optical sensors in a semiconductor device, and in particular to lenses formed in a Complementary Metal Oxide Semiconductor (CMOS) process.

BACKGROUND

Optical sensors are widely used in integrated CMOS devices for conversion of light signals into electrical signals with analog or digital signal output. Such optical sensors (e.g. Photodiodes, Image sensors or Avalanche Photodiodes) have active areas for converting light into an electric signal. Optical binary lenses (i.e. lenses comprising a pattern formed from two materials, where one material may be air, such that the lens has areas of alternating refractive index) can be used to focus incoming light of a certain wavelength into the active area. Normally, the lenses are configured for infrared (or near infrared) sensing. Typically a combination of a lens and added cavities close to the active area is used. The refractive index of the material in which the lens is added and the processing of this material have to be taken into account for this type of optical lens. Commonly, a Fresnel zone plate design is chosen to make the lens.

SUMMARY

Aspects of the present disclosure provide optical sensors, methods of forming optical lenses for optical sensors, and methods of manufacturing optical sensors, as set out in the accompanying claims. In one embodiment the invention is an optical sensor in an integrated Complementary Metal Oxide Semiconductor, CMOS, device, the sensor including a sensor element with an optical active region and a CMOS backend stack including one or more layers. The sensor further includes an optical lens formed in a layer of the one or more layers and arranged to direct light incident upon it towards the sensor element.

Certain embodiments of the invention will now be described, by way of example only, with reference to the accompanying drawings.

DETAILED DESCRIPTION

If the sensor front is illuminated (i.e. as opposed to e.g. back side illumination) it is not possible to collect all of the incoming light into the sensor. Some peripheries to connect the sensor device are necessary, and such areas may be metal covered and not transparent to light. That means there are optical losses as a result of the architecture of the device.

Embodiments described herein may at least partially overcome this problem by providing a lens in the CMOS backend stack (which is located at the front of the device) to focus incoming light into the sensor and thereby increase the fill factor of the device. Although the skilled person will understand the meaning and limitations of "a CMOS backend stack", for clarity it is defined herein as the stack of layers formed in the back-end-of-line (BEOL) process on top of the silicon layer. For example, the metallization layers and inter-layer vias are formed in the BEOL process and are part of the backend stack. The BEOL process is performed after the front-end-of-line (FEOL) process, in which the CMOS devices (e.g. transistors, resistors and photodiodes) are built in the silicon. An advantage of the disclosed system is the formation of a binary lens (i.e. a lens comprising a pattern formed from two materials) in the CMOS process (i.e. in the BEOL process), without requiring any additional layers to be deposited (such as a special cover layer). The lens can be directly integrated in the standard CMOS backend stack after process refinement.

Figure 1:
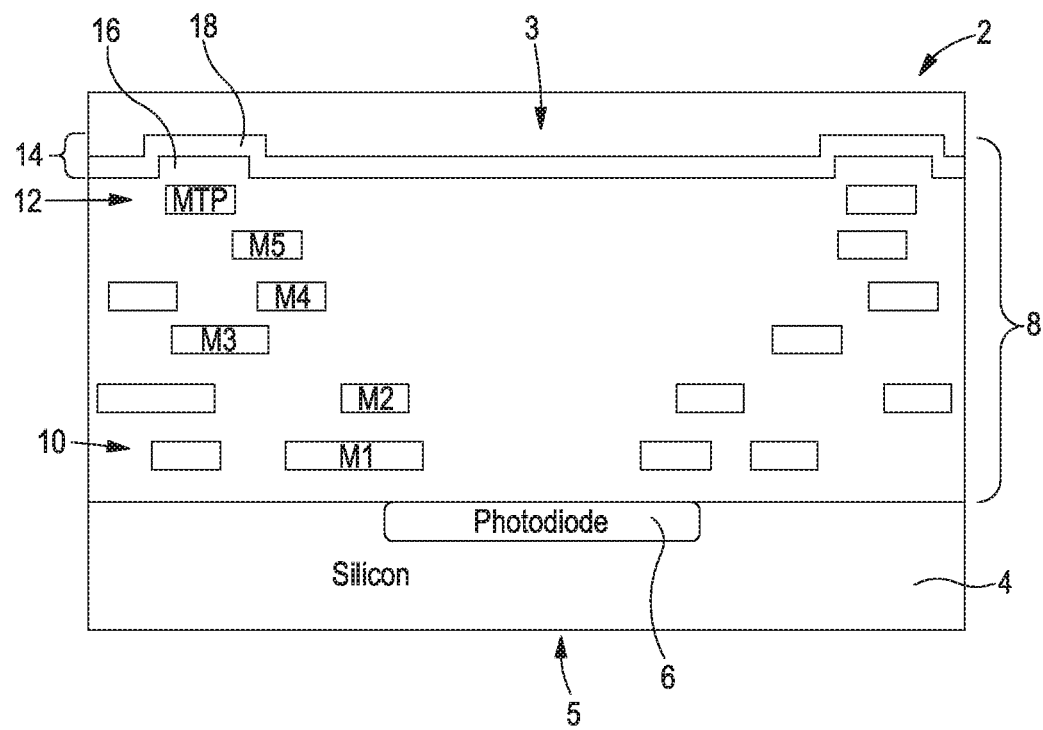
FIG. 1 is a schematic diagram of a cross section of an optical sensor.

FIG. 1 is a schematic diagram of a cross section of an optical sensor 2 in a CMOS device. The sensor 2 has a front 3, a silicon substrate 4 at the back 5, and a photodiode 6 formed in the silicon substrate 4. The photodiode 6 is a sensor element of the optical sensor 2 and corresponds to an optical active region in the substrate 4. The sensor 2 has a six metal processed backend option. That is the CMOS backend stack 8 comprises six metal layers (also referred to as metallization layers), including a first metal layer 10 and a metal top layer 12. A top layer 14, above the metal top layer 12, consists of two dielectric layers 16 and 18, i.e. an oxide layer 16 ($SiO_2$) and a nitride layer 18 ($Si_3N_4$) above. For this sensor structure the optical power (i.e. the intensity in the optical active area) can be increased with a lens.

Figure 2:
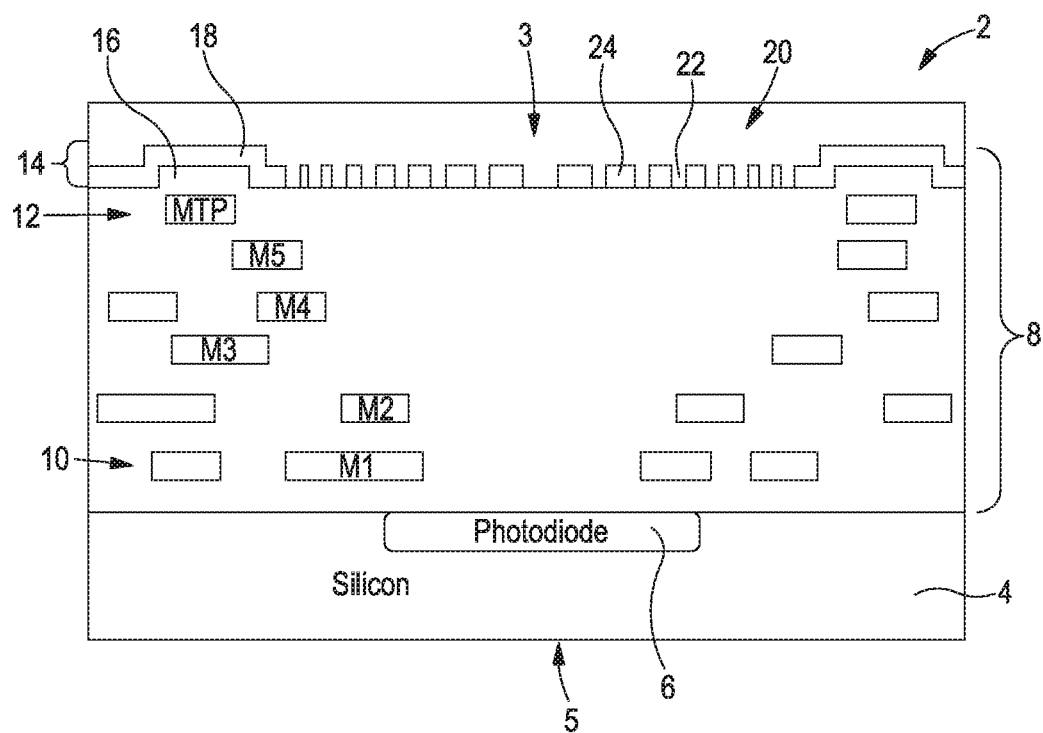
FIG. 2 is a schematic diagram of a cross section of an optical sensor according to an embodiment.

FIG. 2 is a schematic diagram of a similar sensor 2, but with an optical lens 20 according to an embodiment. The optical lens 20 is a binary structure 20 comprising troughs 22 and peaks 24. The lens 20 is formed in the nitride passivation layer 18 of the CMOS backend stack 8 of the sensor 2. The lens is arranged to focus incident light (front-end-illumination) onto the photodiode 6, i.e. into the optical active region of the sensor 2. For clarity, the backend stack 8 is located at the front 3 of the device, such that incident light propagates through the backend stack 8 to the photodiode 6 (i.e. the sensor 2 is a front-illuminated sensor). This is different from a back-illuminated (or backside illuminated) sensor, which is arranged such that light is incident on the silicon substrate 4 from the back 5.

Figure 3:
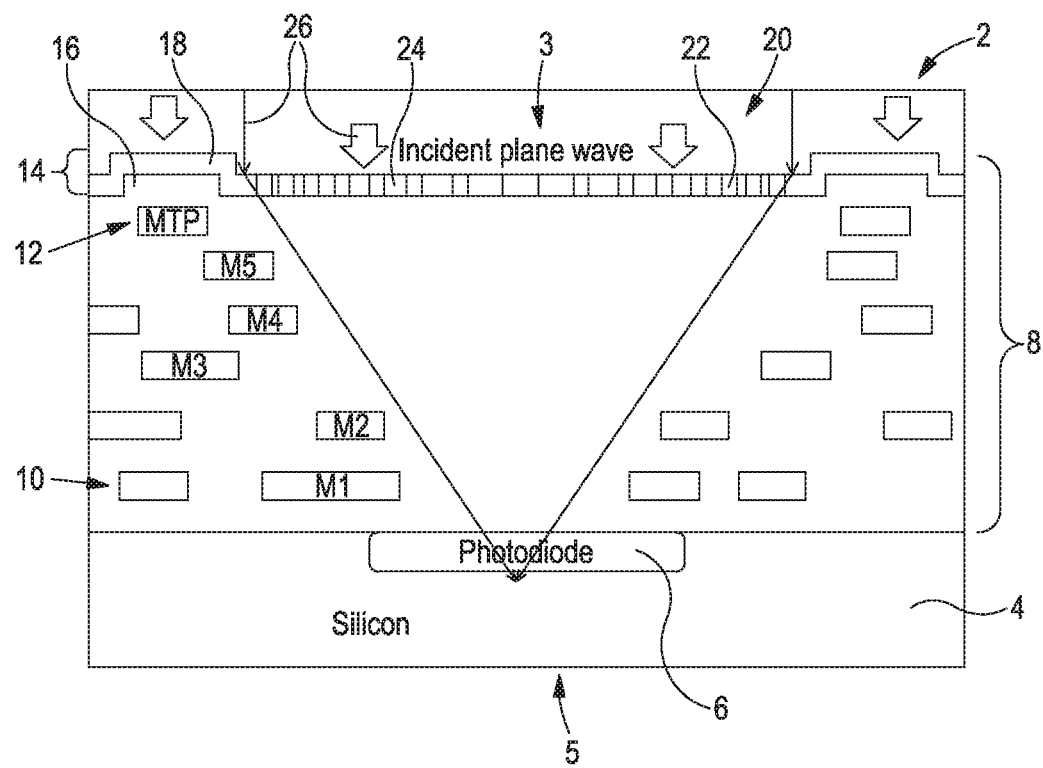
FIG. 3 is a schematic diagram of a cross section of an optical sensor according to the embodiment.

FIG. 3 shows another cross section of an optical sensor 2 according to the embodiment. The optical lens 20, having troughs 22 and peaks 24 directs an incident pane wave 26 into the sensor 2 and focusses the wave into the photodiode 6. The lens 20 is formed in the nitride passivation layer 18 and may extend into the underlying layer 16 (e.g. a silicon oxide layer). The lens 20 focusses the light to a point in the optical active area of the sensor 2. The photodiode 6 is partly obscured by structures in the periphery in the CMOS backend stack 8. For example, the first metallization layer 10 comprises structures, which may obstruct light at normal incidence from reaching the photodiode 6. The lens 20 can direct at least some of the incident light past the opaque structures in the backend stack 8 and thereby increase the fill factor.

Figure 4:
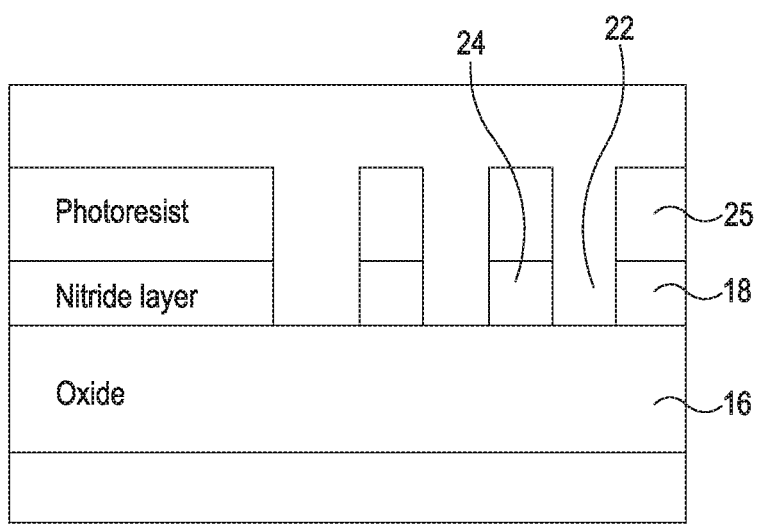
FIG. 4 is a schematic diagram of a cross section of a part of an optical sensor according to an embodiment.

FIG. 4 shows a cross section of the dielectric layers 16 and 18 on top of the backend stack 8. The nitride passivation layer 18 on top is patterned by an additional photo lithographical step and the binary stages (troughs 22) are etched with an additional etch step. FIG. 3 shows a stage in the manufacturing process when the layer of photoresist 25 has not yet been washed away. The additional etch step is also adjusted to the lens design and the dedicated wavelength that the lens is optimized for.

The lens only requires one additional photolithography step to pattern an existing layer, and one etching step to form the lens in this layer. This could in general be any layer in the CMOS backend stack, and in one case in the nitride passivation layer. The refractive index of the medium of the lens and the refractive index of the medium above it have to be different. In general, the lens medium has a higher refractive index (e.g. when the lens is formed in the nitride passivation layer with air above it). A phase shift between the two media provides the focusing effect.

The lens can be designed to work at any target range of wavelengths, and is not limited to operating in any particular wavelength spectrum. The embodiments are flexible for different ranges of the ultraviolet, visible and near infrared spectra. The following formula can be used to design a lens structure that is optimized for a particular wavelength ($\lambda$) of light:

$$r_n = \sqrt{n\lambda f + \frac{n^2\lambda^2}{4}}, \quad (1)$$

where $r_n$ is the radius of the $n^{th}$ ring/edge (n=1, 2, 3, ...) of the binary structure of the lens, $\lambda$ is the (target) wavelength, and f is the focal length.

The depth of the etched troughs of the binary structure is given by:

$$\Delta h = \frac{\lambda}{2 \cdot \Delta n_{refractive}}, \quad (2)$$

where $\Delta n_{refractive}$ is the difference in refractive index of the lens material and the refractive index of the material above it, e.g. $\Delta n_{refractive} = n_{lens\ material} - n_{air}$.

Figure 5:
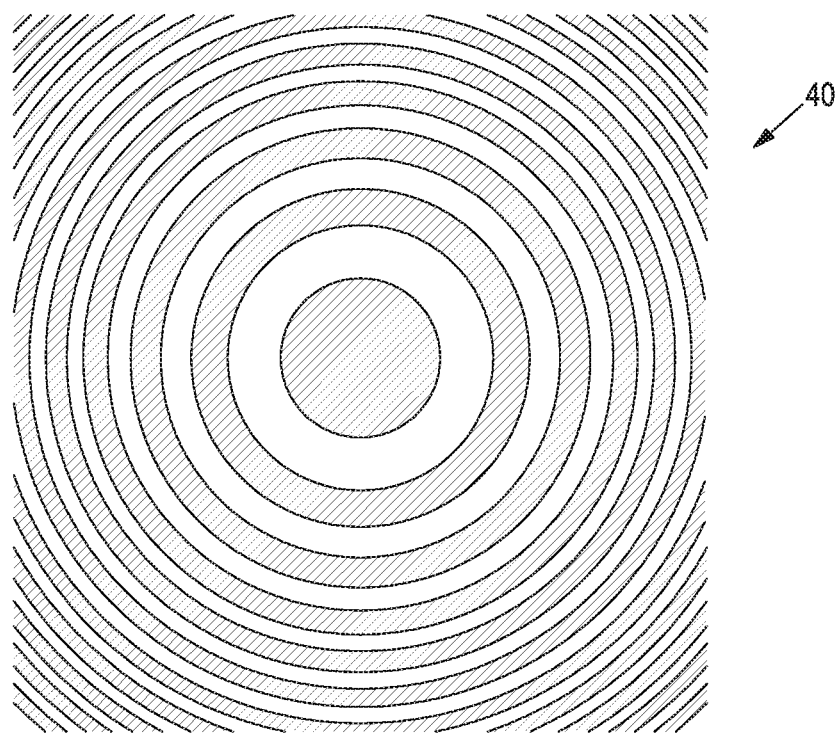
FIG. 5 is a schematic diagram of a lens design.

FIG. 5 shows the design 40 of a lens that may be used in a particular application. The dimensions of the lens are chosen in accordance with the area of the sensor element. The etch depth is adapted to a certain (target) wavelength. The dimensions are also affected by the layer (e.g. the nitride passivation layer) from the CMOS process in which the lens is formed. The design may be generated by equations 1 to 3 for the different ring distances and the desired wavelength. Only the resolution of the process capability (i.e. the limits of the CMOS technology used) limits the minimal distances for the ring radii on the edge. The polarity (peak or trough) of the rings does not matter.

Figure 6:
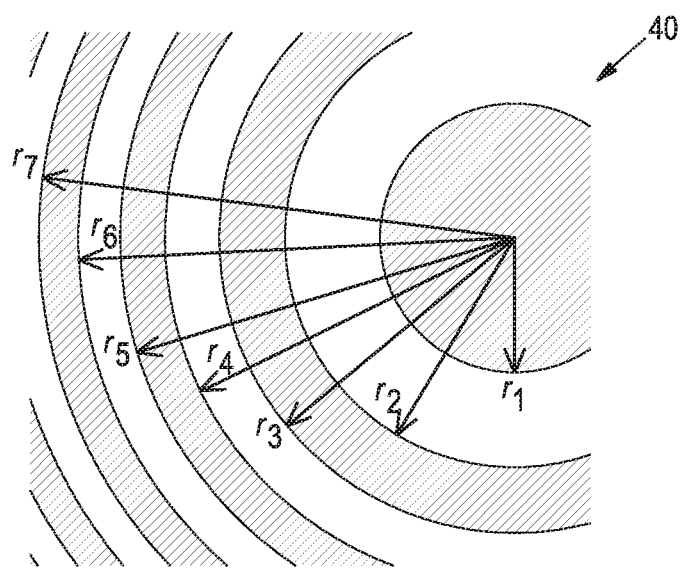
FIG. 6 is a schematic diagram of a part of a lens design.

FIG. 6 shows a part of a similar lens design 40, with arrows indicating the first seven radii as calculated by equation 1.

Figure 7:
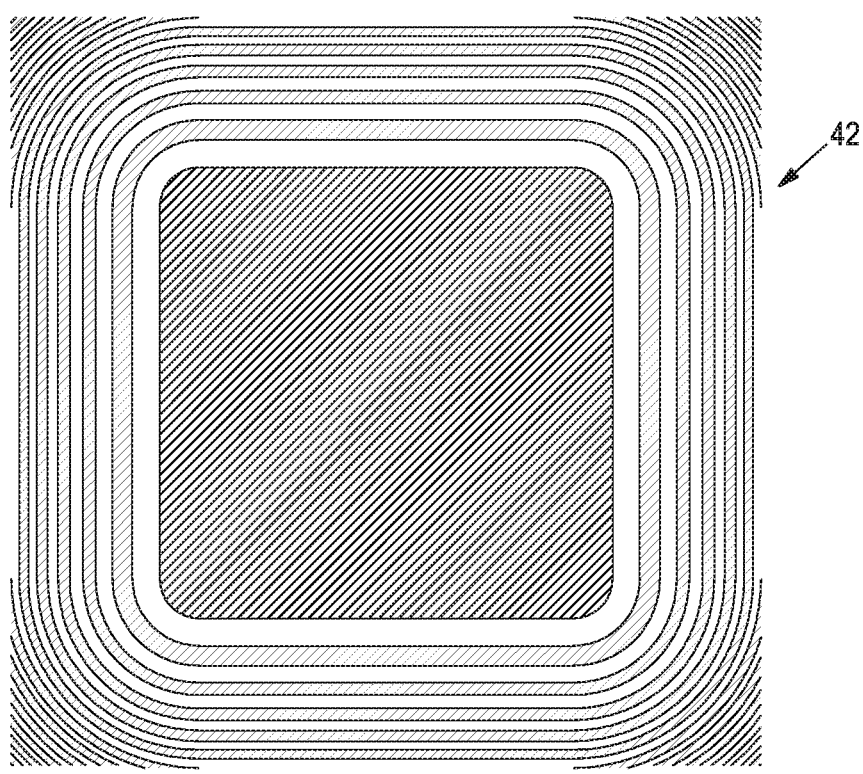
FIG. 7 is a schematic diagram of a part of another lens design.

FIG. 7 shows a modified lens design 42 which concentrates on focusing light from the periphery of the sensor of the device. This design 42 focusses more on the fact that the direction of light has to be changed from the edge of the sensor into the optical active area. Therefore, the Fresnel lens design is extended at the base sides and divided into four parts. This gives the lens a square shape with rounded corners.

Figure 8:
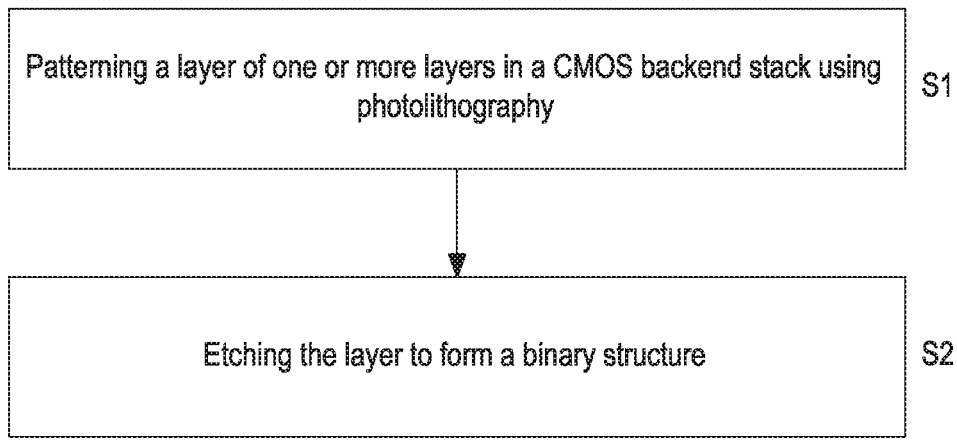
FIG. 8 is a flow diagram illustrating a method according to an embodiment.

FIG. 8 shows a flow diagram illustrating a method of forming an optical lens for an optical sensor according to an embodiment. To aid understanding, reference numerals given in the method below refer back to components of the optical sensor 2 shown in FIG. 2, but the method is not limited to the sensor 2 of FIG. 2. The method comprises patterning a layer 18 of one or more layers 10, 12, 16, and 18 in a CMOS backend stack 8 using photolithography (step S1), and etching the layer 18 to form a binary structure 20 (step S2).

Figure 9:
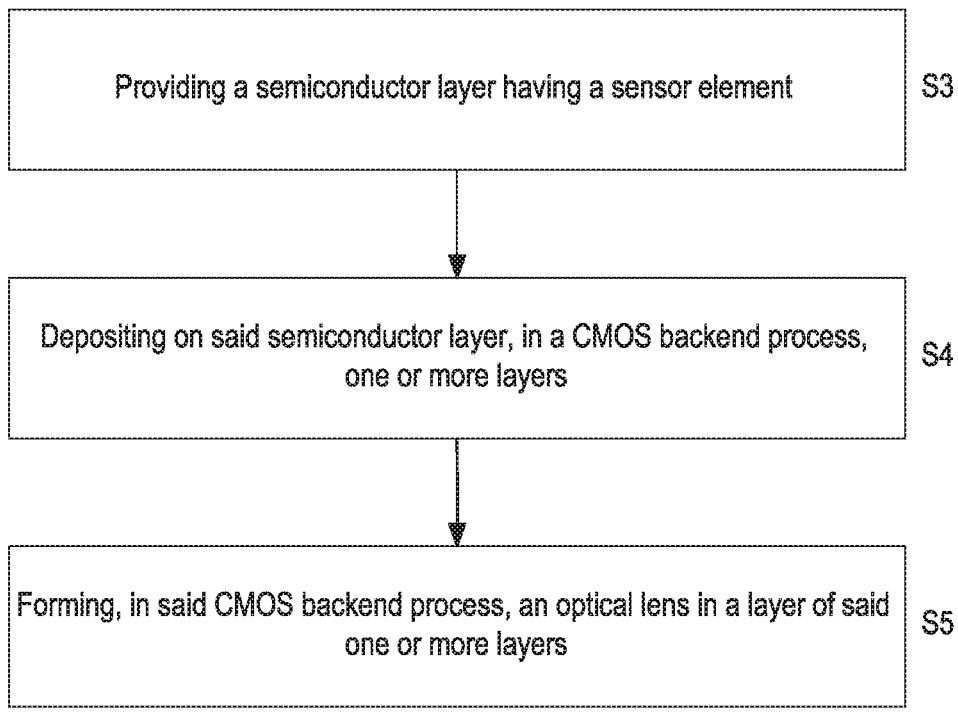
FIG. 9 is a flow diagram illustrating a method according to another embodiment.

FIG. 9 shows a flow diagram of a method of manufacturing an optical sensor according to an embodiment. To aid understanding, reference numerals given in the method below refer back to components of the optical sensor 2 shown in FIG. 2, but the method is not limited to the sensor 2 of FIG. 2. The method comprises providing a semiconductor layer 4 having a sensor element 6 (step S3), depositing on said semiconductor layer 4, in a CMOS backend process, one or more layers 10, 12, 16 and 18 (step S4), and forming, in said CMOS backend process, an optical lens 20 in a layer 18 of said one or more layers 10, 12, 16 and 18 (step S5).

While certain embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

What is claimed is:

1. An optical sensor in an integrated Complementary Metal Oxide Semiconductor, CMOS, device, said sensor comprising:
   a sensor element with an optical active region;
   a CMOS backend stack comprising one or more layers; and
   an optical lens formed in a layer of said one or more layers and arranged to direct light incident upon it towards said sensor element, wherein said optical lens is a binary lens having a binary structure in or on said layer of said one or more layers, and wherein said binary structure comprises a plurality of substantially concentric rings and a radius of an edge of one ring of said plurality of substantially concentric rings is given by $$r_n = \sqrt{n\lambda f + \frac{n^2\lambda^2}{4}},$$

where $r_n$ is said radius of an $n^{th}$ edge of said binary structure, $\lambda$ is a target wavelength, and f is a focal length.

2. An optical sensor according to claim 1, wherein said binary structure has a Fresnel zone plate design.

3. An optical sensor according to claim 1, wherein a depth of said plurality of substantially concentric rings is given by $$\Delta h = \frac{\lambda}{2 \cdot \Delta n_{refractive}},$$

wherein $\Delta h$ is said depth, $\lambda$ is the target wavelength, and $\Delta n_{refractive}$ is a difference between a refractive index of said layer of said one or more layers and a refractive index of a material directly above said layer of said one or more layers.

4. An optical sensor according to claim 1, wherein said binary structure comprises a plurality of nested rectangles with rounded corners.

5. An optical sensor according to claim 1, wherein said one or more layers comprises a plurality of layers, and said binary structure extends through said layer of said one or more layers and into another layer of said plurality of layers.

6. An optical sensor according to claim 1, wherein said one or more layers comprises a dielectric layer, and said optical lens is formed in said dielectric layer.

7. An optical sensor according to claim 6, wherein said dielectric layer is a nitride passivation layer of said integrated CMOS device.

8. An optical sensor according to claim 6, wherein said dielectric layer is an oxide layer.

9. An optical sensor according to claim 1, wherein said one or more layers comprises a plurality of metallization layers including a metal top layer.

10. An optical sensor according to claim 9, wherein said layer of said one or more layers having an optical lens formed therein is one of said metallization layers.

11. An optical sensor according to claim 9, wherein said layer of said one or more layers having an optical lens formed therein is located above said metal top layer.

* * * * *